United States Patent
Tatah et al.

(10) Patent No.: US 9,196,278 B1
(45) Date of Patent: Nov. 24, 2015

(54) LASER ARRAY FOR HEAT ASSISTED MAGNETIC RECORDING

(71) Applicant: Seagate Technology LLC, Cupertino, CA (US)

(72) Inventors: Karim Tatah, Eden Prairie, MN (US); Michael Allen Seigler, Eden Prairie, MN (US); Scott Eugene Olson, Eagan, MN (US); Delai Zhou, Basking Ridge, NJ (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 14/286,287

(22) Filed: May 23, 2014

(51) Int. Cl.
| | |
|---|---|
| *G11B 11/00* | (2006.01) |
| *G11B 5/48* | (2006.01) |
| *G11B 13/08* | (2006.01) |
| *G11B 5/60* | (2006.01) |
| *G11B 5/31* | (2006.01) |
| *H01S 5/40* | (2006.01) |
| *G11B 5/00* | (2006.01) |

(52) U.S. Cl.
CPC ............ *G11B 5/4866* (2013.01); *G11B 5/3133* (2013.01); *G11B 5/6088* (2013.01); *G11B 13/08* (2013.01); *G11B 2005/001* (2013.01); *G11B 2005/0021* (2013.01); *H01S 5/4031* (2013.01)

(58) Field of Classification Search
CPC ..................... G11B 5/4866; G11B 2005/0021; G11B 5/314; G11B 5/6088; G11B 2005/001; G11B 7/1387; G11B 5/3133; G11B 13/08; G11B 6/42; G11B 6/132; G02B 6/122
USPC ................... 369/13.33, 13.32, 13.24, 112.27; 385/129, 14
See application file for complete search history.

(56) References Cited

U.S. PATENT DOCUMENTS

| | | | |
|---|---|---|---|
| 5,195,152 A | 3/1993 | Gupta | |
| 6,154,326 A | 11/2000 | Ueyanagi et al. | |
| 6,166,756 A | 12/2000 | White et al. | |
| 6,999,484 B2 | 2/2006 | Spoonhower et al. | |
| 7,826,702 B2 * | 11/2010 | Dawes | ........................ 385/129 |

* cited by examiner

*Primary Examiner* — Ali Neyzari
(74) *Attorney, Agent, or Firm* — Hollingsworth Davis, LLC

(57) ABSTRACT

An apparatus comprises a unitary laser diode comprising an array of two or more active regions, at least one of which outputs a light beam in response to an input current. The apparatus also includes two or more waveguides, each waveguide corresponding to an active region of the array. At least one of the waveguides receives the at least one light beam from the at least one active region.

18 Claims, 9 Drawing Sheets

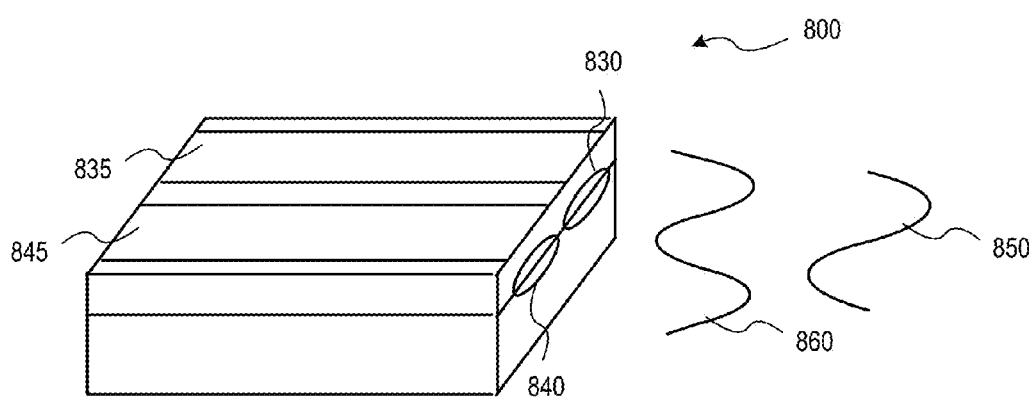
*FIG. 8A*
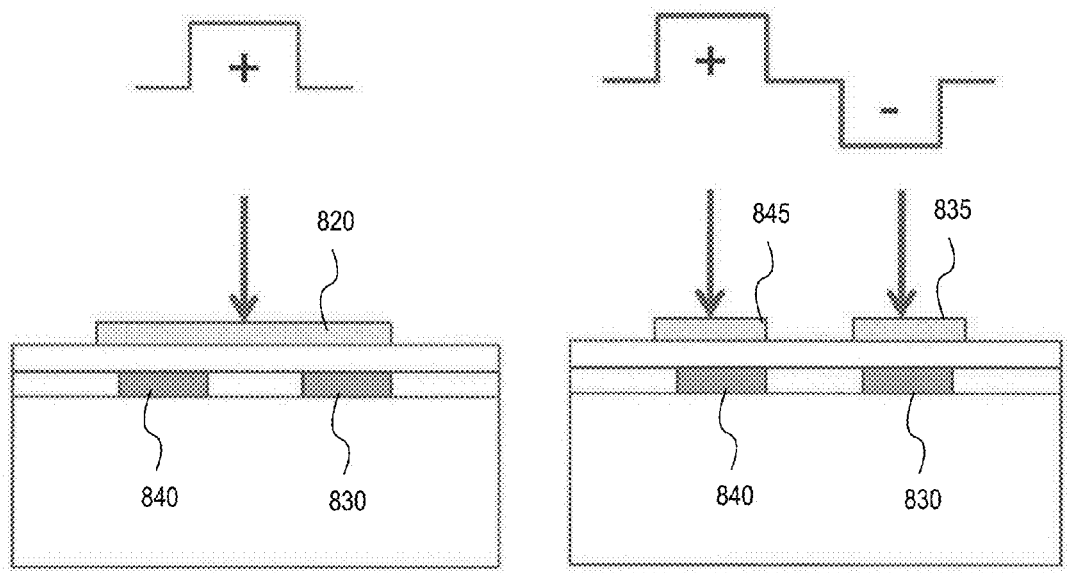
*FIG. 8B*  *FIG. 8C*

LASER ARRAY FOR HEAT ASSISTED MAGNETIC RECORDING

SUMMARY

Embodiments of this disclosure are directed to an apparatus with a unitary laser diode having an array of two or more active regions, at least one of which outputs a light beam in response to an input current. The apparatus also includes two or more waveguides, each waveguide corresponding to an active region of the array. At least one of the waveguides receives the at least one light beam from the at least one active region. In further embodiments, a light combining element receives and combines the at least one light beam from the two or more waveguides. Additional embodiments can include a near-field transducer that receives the combined light, and in response thereto, generates surface plasmons that are directed to a heat-assisted magnetic recording medium.

Further embodiments are directed to an apparatus comprising a unitary laser diode comprising two active regions that together output a pi-phase, TE10 mode beam. The apparatus also includes a focusing element that receives and focuses the beam and a near-field transducer that receives the focused beam. In response to receiving the focused beam, the near-field transducer generates surface plasmons that are directed to a heat-assisted magnetic recording medium.

Still further embodiments are directed to a method. The method comprises generating at least one light beam via at least one active region in an array of two more active regions in a unitary laser diode in response to an input current. The at least one light beam is received from the at least one active region by at least one waveguide of two or more waveguides where each waveguide corresponds to an active region of the array. The at least one light beam is received from the two or more waveguides and combined. A near-field transducer received the combined light and in response thereto, generates surface plasmons. The surface plasmons are then directed to a heat-assisted magnetic recording medium.

These and other features and aspects of various embodiments may be understood in view of the following detailed discussion and accompanying drawings.

BRIEF DESCRIPTION OF THE DRAWINGS

FIG. 8A shows modes generated by a dual array laser diode according to an example embodiment;

FIGS. 8B-C show alternative current injection contacts for a dual array laser diode according to an example embodiment.

DETAILED DESCRIPTION

Heat assisted magnetic recording (HAMR), otherwise known as thermal assisted magnetic recording (TAMR), employs a laser diode as a light/heat source for heating a magnetic recording medium. In a HAMR device, the laser light is guided through the magnetic recording arrangement, e.g., a slider, via one or more optical elements, focused on a near field transducer (NFT), and emitted to create a "hot spot" on a magnetic recording medium.

Figure 1:
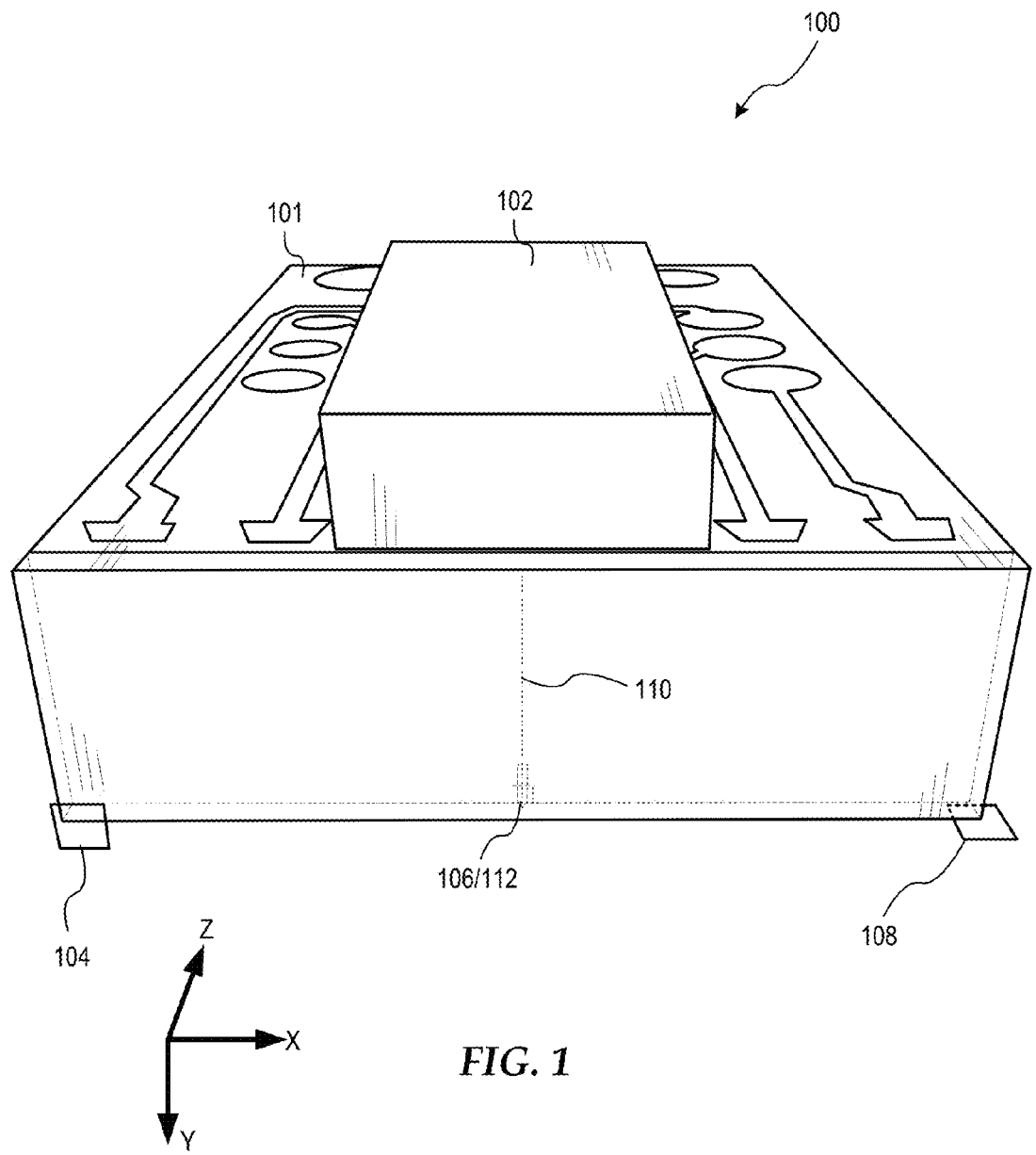
FIG. 1 is a perspective view of a laser arrangement according to an example embodiment.

In some embodiments, the HAMR recording head includes a slider assembly 100 as shown in FIG. 1. The slider assembly 100 includes an energy source, here a laser diode 102, configured to produce laser light that energizes an optical antenna of an NFT 106. The laser diode 102 can be mounted external, or integral, to a body 101 of the slider assembly 100. The laser diode 102 may be physically attached via a submount (not shown) and the submount attached to a magnetic recording slider. The laser diode 102 can be mounted in other configurations, e.g., mounted on a trailing edge surface 104 or located in a cavity therein. The illustrated laser diode 102 is an edge-emitting laser, although the concepts discussed below in various embodiments may be applicable to other laser configurations, e.g., surface emitting lasers.

The laser light produced by the laser diode is guided to the NFT 106 through an optical waveguide 110. The light may be focused on the NFT 106 by a focusing device such as a waveguide or a parabolic mirror. The NFT 106 is held proximate a media-facing surface 108, which is also referred to as an air bearing surface (ABS). A write transducer 112 is located near the NFT 106. The write transducer may include a write coil, a write pole, and one or more return poles. The write transducer 112 applies a magnetic field to a recording medium that is held close to, and moves relative to, the media-facing surface 108 in the downtrack direction (z-axis). Proximate the media-facing surface 108, the HAMR slider assembly 100 may also include one or more magnetic read heads that read data from the recording medium as it moves in the downtrack direction. The slider assembly 100 tracks radially across the magnetic recording medium in a cross-track direction indicated by the x-axis of FIG. 1.

The laser diode 102, whether configured as an edge-emitter or surface emitter, may be constrained when implemented as a single emitting, or single active region, laser diode. These constraints can include alignment tolerance of the laser diode to the slider, reliability of the active region, and power output. For example, the power output of a surface emitting single mode diode may be lower than that required for HAMR (e.g., less than 50 mW).

Single mode edge emitting lasers may have sufficient power for HAMR, although tend to demand tight laser to slider alignment tolerance with limited durability. Single mode edge emitting lasers have a typical spot size of 1×3 µmeters that result in a laser-to-slider alignment tolerance in the sub-micron range in one direction (e.g., the transverse direction) and sub-2 micron range in another (e.g., the lateral direction). These parameters may be satisfied through active laser-to-slider alignment in both directions. However, active alignment can reduce the overall production throughput. For example, the alignment process may take as much as 5-10 seconds for each direction.

Single mode edge emitting lasers also have a predictable durability/reliability. Over time, operation will break down or wear out the laser diodes. Experimentally, such failure rate (FR) can be approximated with the following equation:

$$FR \propto I^m * P^n * \exp(-E_a/k_B T) \qquad \text{Eq. 1}$$

In Equation 1, I, P, and T are laser operating current, power and junction temperature, respectively. Thus, diode operation at higher power, current, and/or junction temperature, will have higher failure rates. The parameters of m, n, and $E_a$ can be experimentally fitted but tend to be material and design dependent. For example, parameters for an AlGaAs-based edge emitting diode could be m+n≈4, $E_a$≈0.4 eV. An edge or surface emitting laser array with multiple active regions, as disclosed in various embodiments below, can be used to improve power output, alignment tolerance in at least one direction, and reliability for a magnetic recording arrangement light source.

Figure 2:
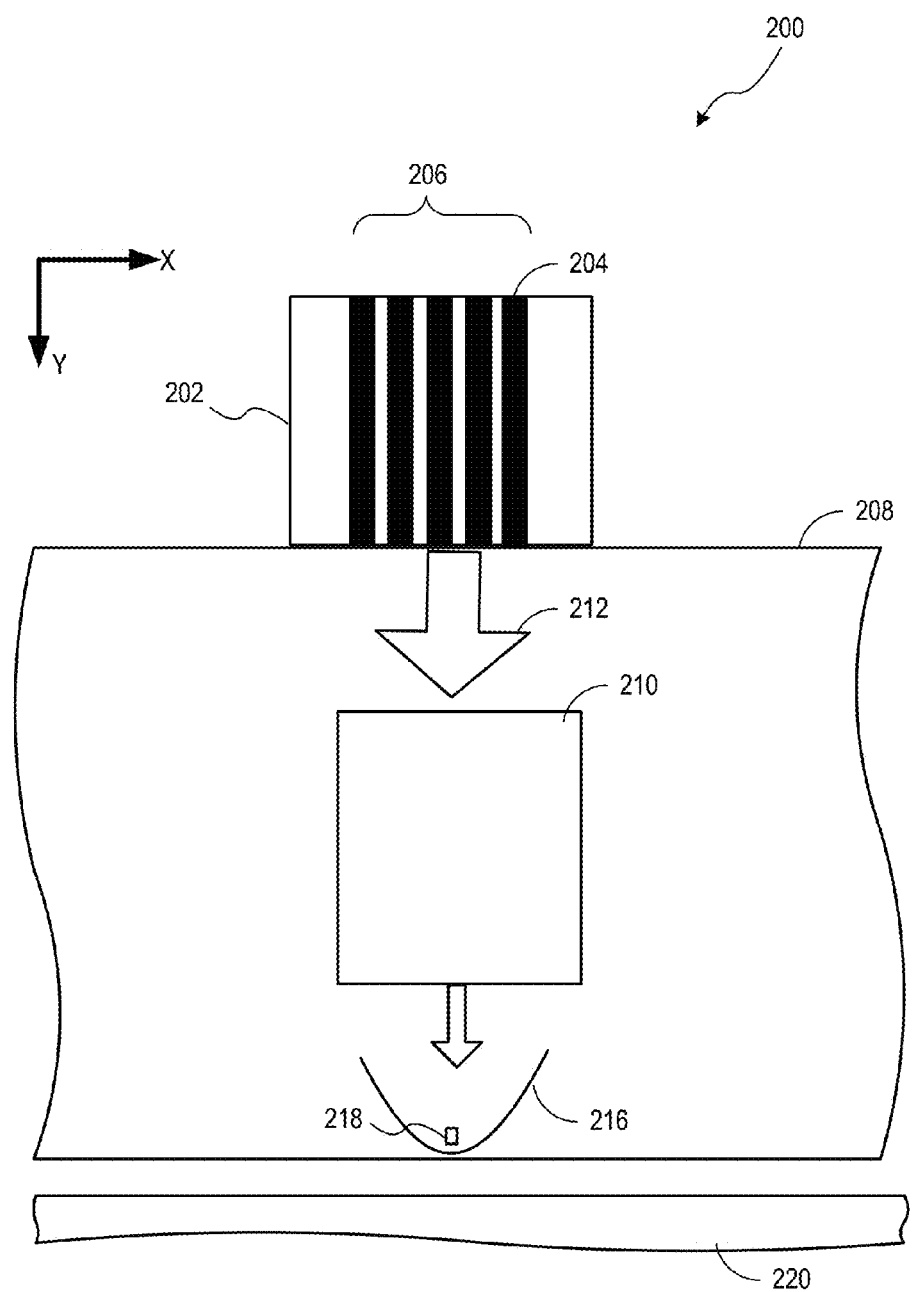
FIG. 2 is a plan view of a coherent laser arrangement according to an example embodiment.

Embodiments disclosed herein are directed to a HAMR light delivery technique using monolithically fabricated coherent edge or surface emitting laser arrays instead of a single emitting diode. An example of such a laser array is illustrated in FIG. 2 (not to scale). Slider assembly 200 includes light source 202 and slider 208. Light source 202 can be a unitary laser diode having a coherent laser array 206 comprised of two or more (e.g., five being shown) vertical cavity, surface-emitting active regions 204, where at least one of the active regions outputs a light beam in response to an input current.

Each of the active regions of the array 206 can be configured to be activated separately. The laser array emits a wide, coherent light, illustrated by arrow 212, that can be coupled into a combining element 210. Combining element 210 can be any variety, or combination, of optical combining devices, such as lenses, mirrors, waveguides, etc. For example, the combining element 210 may include two or more waveguides, where each waveguide corresponds to an active region of the array and at least one of the waveguides receives at least one light beam from the at least one active region.

Another light combining element, here shown as solid-immersion mirror (SIM) 216 can receive and combine the at least one light beam from the two or more waveguides and deliver the light to an NFT 218. The NFT 218 receives the combined light and, in response thereto, generates surface plasmons that are directed to a heat-assisted magnetic recording medium 220.

The coupling of the emitted light 212 with the combining element 210 can eliminate or reduce alignment constraints on coupling the light source 202 to the slider 208. For example, the need for alignment in the lateral, cross-track direction (x-direction) may be unnecessary. The top opening of the SIM 216, can be approximately 30-50 μm wide, while the laser array 206 can be 10 μm narrower than the SIM opening. This can be within the capability of pick and place tools to locate the laser array 206 within the SIM opening resulting in active alignment in only one dimension (e.g., laser transverse direction, z-direction).

The laser array 206 design can reduce optical loss and control the laser array's mode. If the emitted light 212 is collimated, the light delivery path may be shortened compared to previous, single emitter light source designs. The shorter, more direct light path reduces or removes the use for optical elements such as turning mirrors, beam expanders, and/or collimators in the slider 208. As each optical element introduces optical loss, the reduction and/or removal of optical elements reduces the overall amount of optical loss. In addition, the coherent laser array 206 can be manufactured monolithically such that no external optical elements are needed. This can further reduce optical loss for the slider assembly 200. Design of the laser array 206 can also control the laser array's mode. For example, certain active regions 204 can be out of phase with other active regions 204 of the array (e.g., left half and right half of the array are out of phase with each other). This can provide laser polarization for combination with certain NFTs.

A coherent laser array 206 can also reduce the failure rate. This is shown using the equation (Eq. 1) above. Assuming a five active region array (as shown in laser array 206) with a lateral spot size of ~20 μm and that each active region 204 has the same threshold current density (~1200 A/cm²), slope efficiency (~1.1 W/A), and operating power (50 mW), a simplified calculation shows that each active region's operating current is 60%. Thus, the operating power of each active region is 20% of a single emitter. Using Eq. 1, the failure rate for each active region is only ~1.6% that of a single emitter laser. Thus, a coherent array has a higher threshold current and lower efficiency.

An array of active regions may cause more heating and experience higher junction temperatures than a single active region. For example, calculations show that the temperature for an array can be ten degrees higher than for a single emitter. However, this is a secondary impact since a ten degree junction temperature increase corresponds to a 40% increase of failure rate. But, the failure rate of an array's individual active regions would still only be ~2.2% of the failure rate of a single emitter. An array also has much lower thermal resistance than a single emitter, which reduces its junction temperature (e.g., 100 C/W vs 250 C/W). Overall design enhancements of the laser array however, such as reducing the threshold density and increasing efficiency, can further reduce the temperature difference between an array and a single emitter.

While higher power for an array may also be desired to compensate for light being blocked by features inside the combining element 210, there is also about 20% less optical loss with the array due to the less complicated, shorter light path compared to a single emitter laser. Even with a 50% higher output for a laser array, each of the array's active regions would still have a failure rate less than 10% that of a single emitter laser. Moreover, the single mode power of a single element, vertical cavity surface emitting laser (VCSEL) is limited (e.g., <50 mW) to a level less than the power currently required for HAMR because the laser mode size is too small. A coherent laser array 206 improves the VCSEL single mode power to a level satisfactory for HAMR.

A single emitter's single mode output power can be limited by the small output aperture. Alternatively, a diode laser array increases the coherent output power. Each laser array may include a series of substantially identical, closely-spaced single mode active regions so that all the active regions' emissions can couple together, e.g., via a combining element 210. Two or more active regions of the array can together output two or more light beams in response to input current, and the light combining element 210 can receive and combine the two or more light beams, e.g., from two or more waveguides. In some embodiments, the two or more active regions are adjacent each other.

The laser array can be designed to operate at only one array mode. Two or more light beams, e.g., from two adjacent active regions, can be coupled so that the mode can be either out-of-phase or in-phase. In either case, the amplitude of the light can be controlled by the injected current. This is shown in both FIGS. 3A and 3B, where the light output from each active region is different. By controlling the amplitude, the combined mode shape and symmetry are controlled. Both the depth and spacing of the active regions can define mode profiles. Various other properties, such as wavelength of emitted light, may be determined by the materials selected for constructing the laser diode, and the technique is applicable to all wavelengths.

Figure 3A:
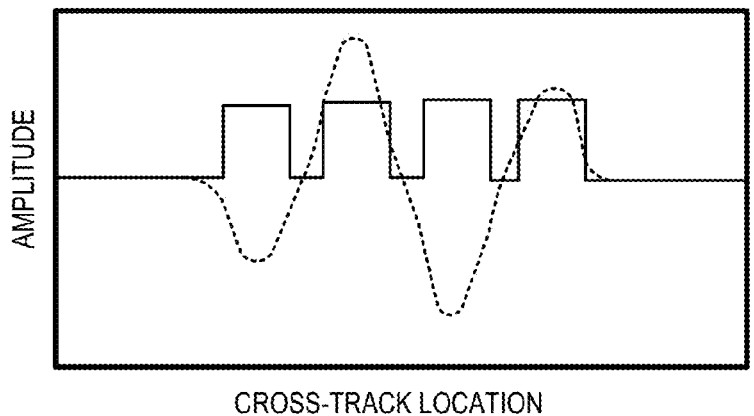
FIGS. 3A-3C illustrate various coupling modes according to an example embodiment.
Figure 3B:
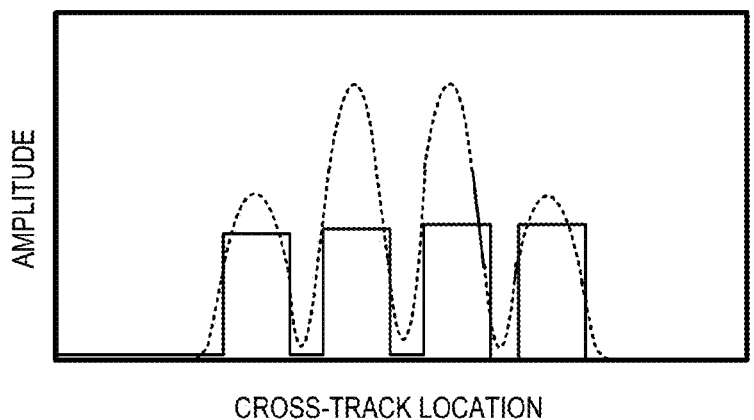
Figure 3C:
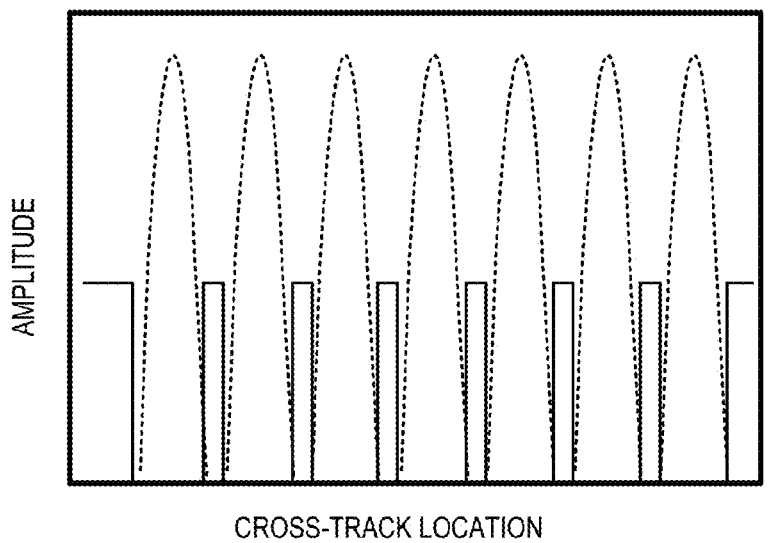

The coupling between active regions can be achieved by any variety of coupling such as evanescent coupling, leaky wave coupling, diffraction coupling, etc. For example, two or more light beams can comprise a pi-phase, TE10 mode beam. Mode profiles of example coupling techniques are illustrated in FIGS. 3A-C. FIG. 3. A illustrates evanescent coupling in in-phase mode, while FIG. 3B illustrates evanescent coupling in out-of-phase mode. FIG. 3C is a further example of an in-phase mode with leaky coupling and uniform output across all active regions being used. The use of two or more coupled active regions reduces energy concentration in the laser diode due to the improved thermal impedance with a coherent laser array as compared to a single emitter.

Figure 4:
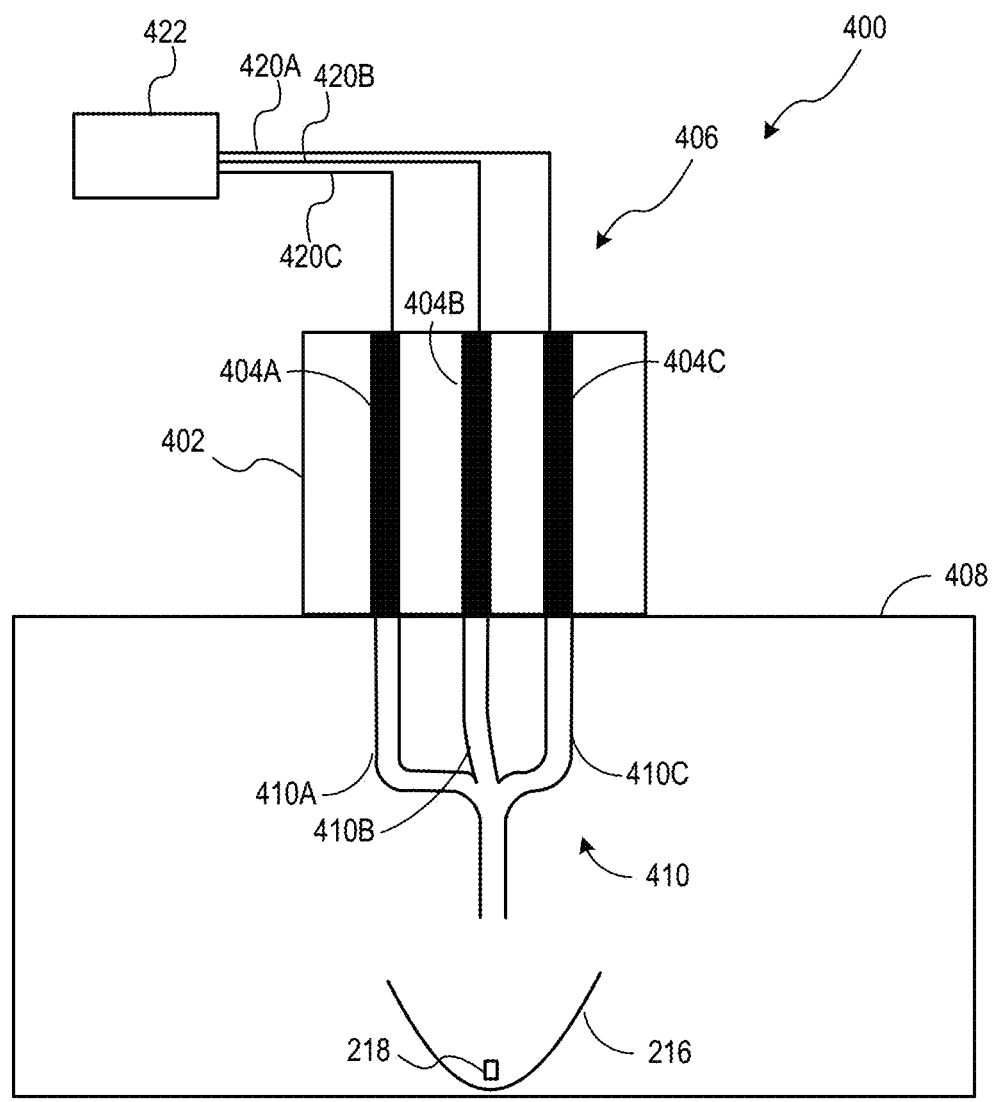
FIG. 4 is a plan view of a combining arrangement for a coherent laser arrangement according to an example embodiment.

In another embodiment, shown in FIG. 4, each of the active regions can be operated individually. Laser arrangement 400 includes light source 402 and slider 408. Light source 402 includes a coherent laser array 406 comprised of multiple (e.g., three being shown) active regions 404A-C. The emitted laser light is coupled by a combining element 410. While combining element 410 can be any variety of optical combining devices, it is illustrated as a plurality of waveguides 410A-C, where each waveguide receives the laser output of an individual active region 404A-C.

Each of the active regions 404A-C is coupled to a separate control line 420A-C. A controller 422 may individually activate the control lines 420A-C (e.g., apply an electrical current) to active respective active regions 404A-C. The controller 422 may include analog and digital circuitry and may be coupled to sensors (not shown) that determine failure of one of the active regions 404A-C. The controller 422 may activate more than one active regions 404A-C at a time in any combination, and in such a case the combining element 410 may combine multiple outputs.

Individual operation of the active regions 404A-C can increase the reliability and lifespan of the light source 402. For example, active region 404A can be operated until failure, at which point another active region is operated, e.g., 404B. Thus, only one active region of the array is activated at a given time. Then, a second active region of the array can be configured to output a light beam in response to input current when the first active region fails. The change in active region operation can be automated upon detection of failure of an active region, or can be performed manually.

Figure 5A:
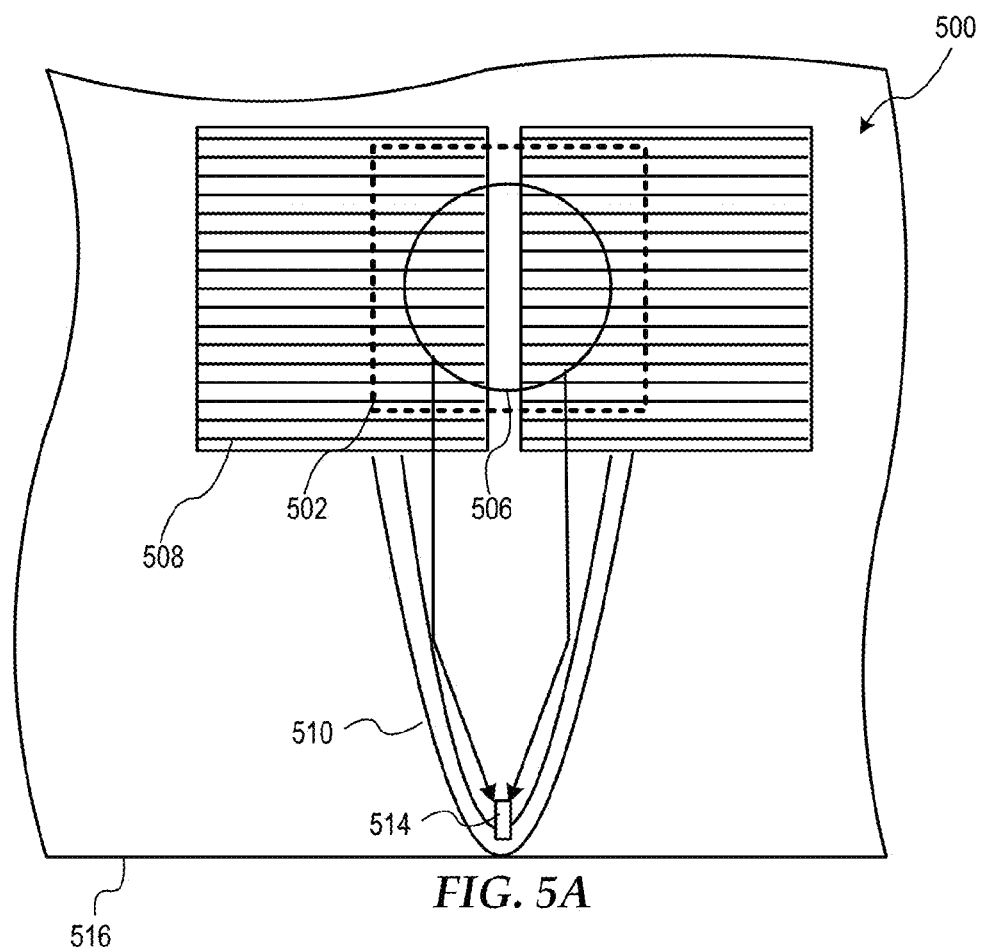
FIG. 5A is a cross-sectional view of a laser arrangement according to an example embodiment.
Figure 5B:
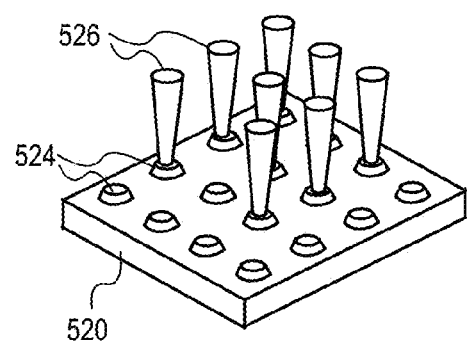
FIG. 5B is a perspective view of a laser array according to an example embodiment.

A coherent laser array light delivery system, according to the disclosed embodiments, is not limited to lasers mounted to the top of a slider (also referred to as laser-on-slider, or but can also be applied to laser mounted on a slider trailing edge (also referred to as laser-in-slider, or LiS). This is also applicable for light delivery systems using surface emitters, such as a VCSEL, and grating couplers, as shown in FIGS. 5A-B. Edge-emitting lasers may also be mounted on a trailing edge, e.g., using modified light coupling paths to facilitate light being emitted from an edge of the laser.

In reference to FIG. 5A, a trailing-edge view of a read/write head 500 according to an example embodiment is shown. Region 502 represents an outline of the VCSEL laser that launches light into near-normal incidence angle optical grating coupler 508. An optional sealing ring between the laser 502 and optical grating coupler 508 may help contain laser emissions and may provide other functions (e.g., heat sinking, electrical connectivity, etc.). Laser light 506 launched into the grating coupler 508 is guided through an optical core layer to a coupling element 510, shown here as a focusing solid immersion mirror (SIM), and a NFT 514 that provide the localized heat source at the ABS 516 for HAMR recording.

FIG. 5B illustrates an array 520 of the VCSEL laser 502 of FIG. 5A in more detail. The laser 502 is a 2-D coherent array with a plurality of active regions 524 that each emit light 526. The active regions 524 can be separately controllable so that any number of active regions 524 can be operable together. Since a subset of active regions can be operated together, the light emitted from the active regions can be coordinated, or coupled, to generate desired modes.

The laser diode array design can also be customized for specific uses. For example, a laser diode can use multiple active regions to generate a mode matched for the NFT being used. Some HAMR LoS optics utilize an NFT excited with pi-phase TE10 mode laser light focused by a coupling element such as a SIM. The pi-phase mode can be generated passively using a split mirror, phase sections of a SIM, and/or an S-shaped branch waveguide. These passive techniques may introduce losses and take up real estate in the slider. Alternatively, the "TE10 like" antisymmetric supermode can be generated at the laser source. This is a more economical method for the leaky pipe power budget and saves on slider real estate by reducing the laser resonator length and avoiding adding the slider optical elements used in the passive technique to generate a pi-phase dual beam. Generating the pi-phase TE10 mode at the laser source allows for excitation of the NFT without optical loss and without additional optical elements taking up slider real estate. Examples of laser diode arrays designed to generate a pi-phase TE10, antisymmetric mode for use with an NTL or NTP NFT are discussed further below.

Figure 6A:
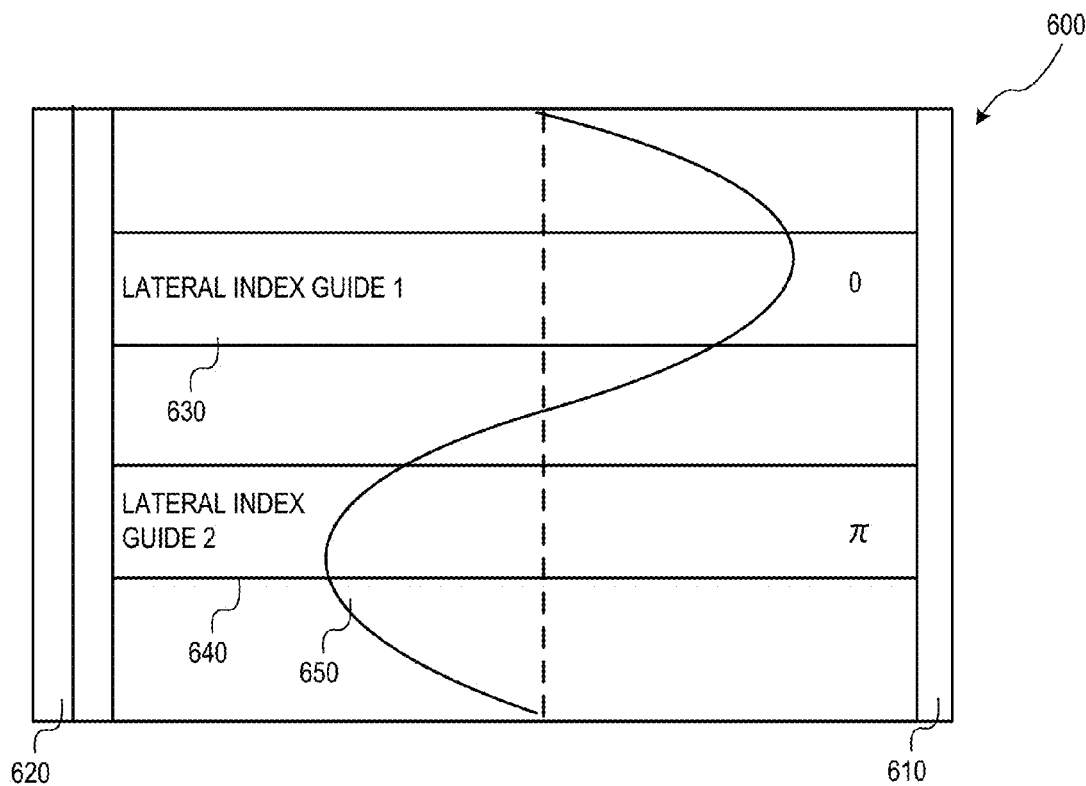
FIG. 6A-B is a schematic view of a dual array laser diode according to an example embodiment.

FIG. 6A illustrates a laser diode 600 having a dual core coherent laser array for use in various embodiments. The dual array index waveguide includes a first waveguide 630 coupled with a second waveguide 640 in a quantum well gain laser between front facet reflector 610 and back facet reflector 620. The first waveguide 630 generates a light beam at a desired phase, e.g., 0 phase. The second waveguide 640 generates a light beam out of phase, e.g., π phase, from the first light beam. Thus, the dual waveguides together generate an antisymmetric, pi-phase dual light beam. The mode of the light beam is determined by the laser diode design.

Figure 6B:
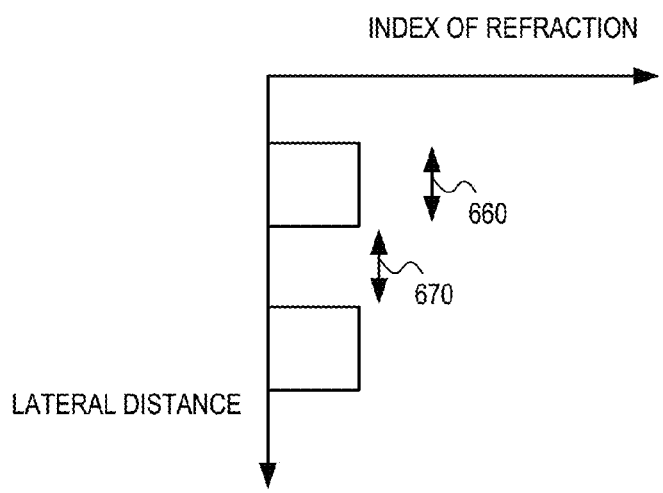

Parameters influencing the laser diode light beam mode are shown in FIG. 6B. The design of the waveguides, and their relationship to each other, control the mode of emitted light. Both the width 660 of the waveguides 630, 640 and the width 670 of the gap-coupling region between the waveguides 630, 640 control the mode of emitted laser light. The waveguides 630, 640 can be substantially the same width, or can differ, as desired. However, such a laser structure overall allows for a shorter cavity laser as compared with a single guide/strip (single emitter) laser for a given power. For example, to maintain 50 mW power in the dual core coherent laser array, the length of the laser resonator can be halved, as compared with a single core laser. The structure also creates a lower profile for an overall HAMR head design.

Figure 7:
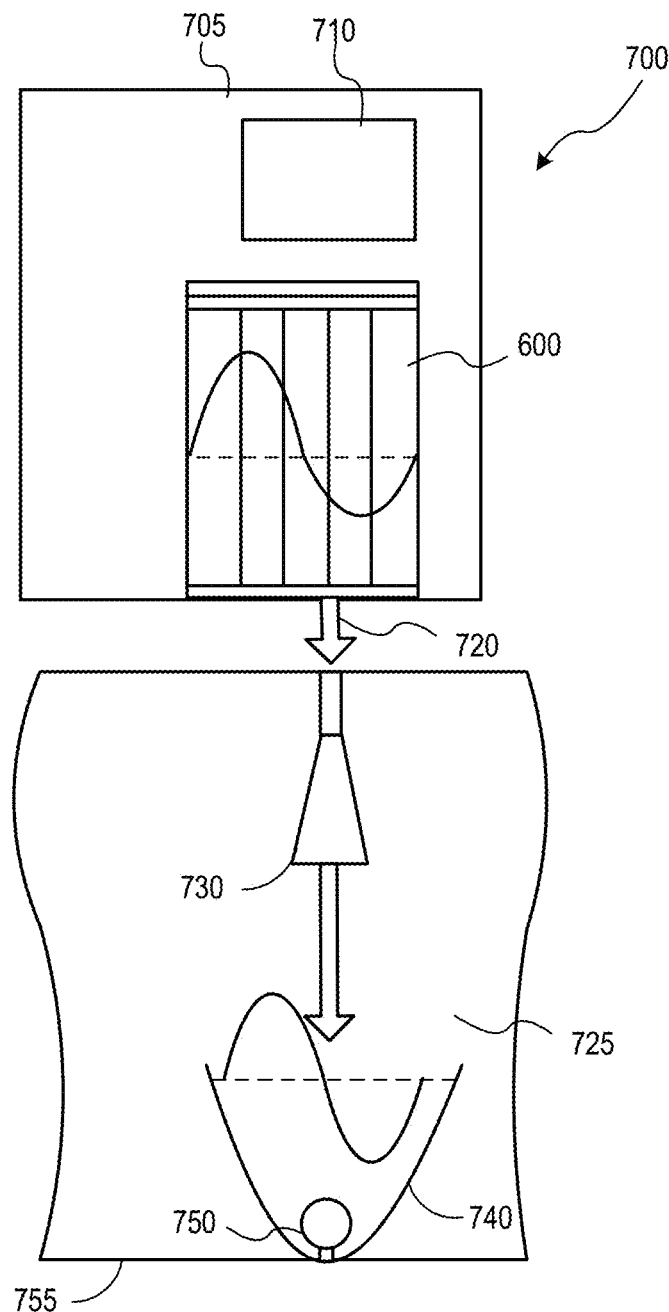
FIG. 7 shows a dual array laser arrangement according to an example embodiment.

A laser arrangement 700 for a HAMR head, according to various embodiments, is illustrated in FIG. 7. A light source 705 includes a current injection contact area 710, such as a photodiode, and a dual core coherent array 600. As discussed above, the laser array 600 can be part of a unitary diode including at least two active regions that together output a pi-phase TE10 mode beam. The emitted laser light 720 is received and focused by a waveguide 730 in the slider 725. The illustrated waveguide 730 is configured as a tapered beam expander. This example includes a SIM 740 that focuses light received from the waveguide 730. Alternative embodiments may not utilize a SIM and instead use a dual directional waveguide.

An NFT 750 receives the focused light beam from the focusing element 730, 740 and generates surface plasmons that are directed to a heat-assisted magnetic recording medium. In this example the NFT 750 is shown as a circular disk that has a peg protruding towards the ABS 755. It can be seen that the TE10 antisymmetric mode beam generated by the laser diode 600 maintains the mode through the slider optical elements to the NFT 750. The laser arrangement 700 is designed so as to have a dual index guided gain stripe to generate the antisymmetric mode like a supermode to excite resonant plasmonic NFTs. Here, the generated antisymmetric, pi-phase dual beam is compatible with the excitation mode of the illustrated disk-peg NFT. The antisymmetric supermode is similar to the mode generated in a dual directional coupler waveguide. However, the medium has gain and optical feedback to form a laser.

A dual core coherent laser array can be designed to produce various laser modes, as illustrated in FIG. 8A. The coherent laser array 800 includes a first active region 830 coupled with a second active region 840. The active regions 830, 840 have respective current injection contact areas, stripes, 835, 845. In an array with multiple active regions, the laser diode can have a current injection stripe contact for each active region. The active regions 830, 840 can be coupled to produce an antisymmetric laser mode 850 or a symmetric laser mode 860. Spreading the gain from a single waveguide, in a single emitter, to a coupled dual guide in the gain medium spreads the energy over a larger volume. This lowers the fluence or power/area at the laser facets to close to half that of a single emitter laser. This reduces/minimizes catastrophic mirror damage of the lasers. The spreading of energy also lowers the current density since the current injection area is doubled. This reduces/minimizes active gain medium internal catastrophic damage. The control parameters in the mode design for an antisymmetric mode include 1) current injection stripe contact width, 2) current injection stripe contact pitch spacing, 3) active region/waveguide width, 4) active region/waveguide pitch spacing, 5) the index of refraction of the core, and 6) the cladding gap between the cores.

FIGS. 8B-C illustrate various embodiments for controlling a coherent phase locked coupled laser. The coherently coupled laser array can be controlled by both dual core waveguide confinement in the lateral direction, and/or separate current injection stripe contacts. These design parameters are controlled to generate a laser mode to best match the NFT implemented in a corresponding slider. For example, a pi-phase, TE10 mode beam is preferred when the NFT is a NTL. At least two types of stripe contact configurations may be used to inject current to the laser diode. FIG. 8B illustrates dual active regions 830, 840 with a single current injection stripe contact 820. FIG. 8C illustrates two current injection stripe contacts 835, 845 which correspond to respective active regions 830, 840. The dual stripe may be used for laser pulse dynamics since it provides for differential RF signal injection. Driving the laser differentially from a pre-amp chip provides improved noise immunity. Methods for using a dual core coherent laser array in various embodiments are discussed below.

Figure 9:
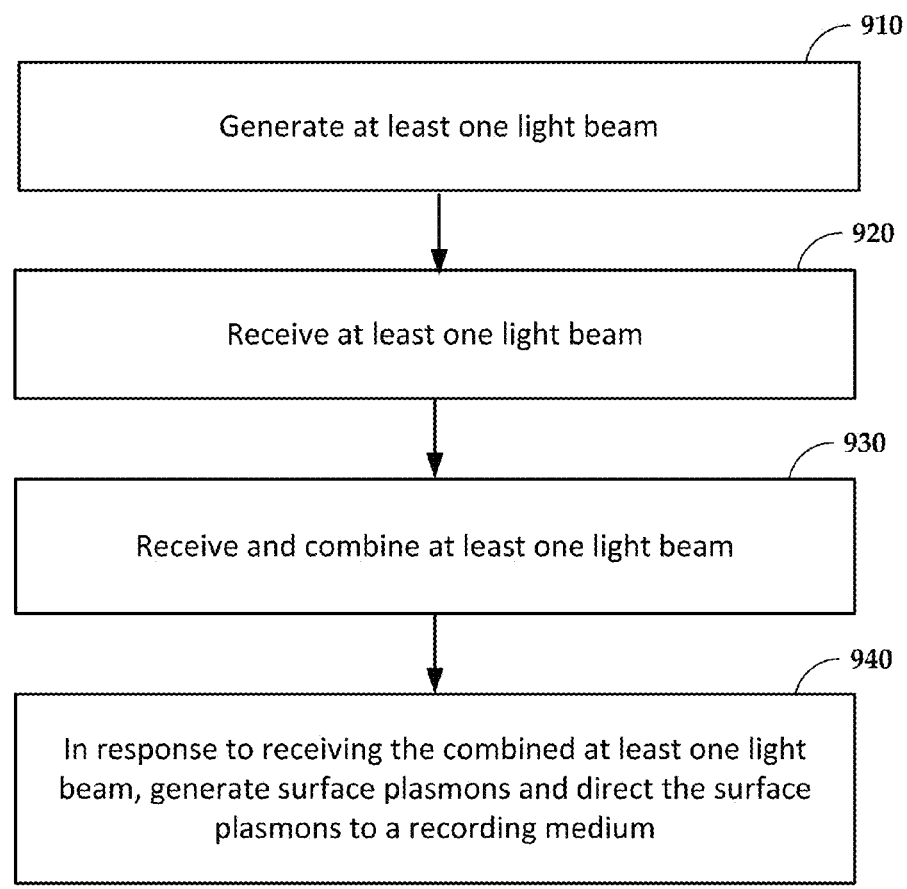
FIG. 9 is a flowchart of a method according to an example embodiment.

FIG. 9 is a flowchart illustrating a method according to an example embodiment. The method involves generating at least one light beam via at least one active region in an array of two more active regions in a unitary laser diode in response to an input current 910. The unitary laser diode can be any variety of laser diode comprising a laser array. For example, the unitary laser diode could be an edge or surface emitting laser producing coherent light beams, as discussed above. The at least one light beam is emitted from an active region into a slider toward a head media interface and received by at least one waveguide of two or more waveguides 920. Each of the two or more waveguides corresponds to an active region of the laser array. The at least one light beam is received from the two or more waveguides and combined 930. The one or more light beams can be combined by any variety of combining device such as a tapered optical waveguide or a parabolic mirror. In response to receiving the combined one or more light beams, a NFT generates surface plasmons and directs the surface plasmons to a heat-assisted magnetic recording medium 940. The surface plasmons can then facilitate heat assisted magnetic recording on the medium.

In various embodiments, two or more light beams are generated via two or more active regions. The two or more light beams can be coupled in any combination of the following modes: evanescently, in-phase, out-of-phase, and leaky. In some embodiments, the generated light beams are antisymmetric, such as a pi-phase, TE10 mode beam.

It is to be understood that even though numerous characteristics of various embodiments have been set forth in the foregoing description, together with details of the structure and function of various embodiments, this detailed description is illustrative only, and changes may be made in detail, especially in matters of structure and arrangements of parts illustrated by the various embodiments to the full extent indicated by the broad general meaning of the terms in which the appended claims are expressed.

What is claimed is:

1. An apparatus, comprising:
a unitary laser diode comprising an array of two or more active regions, at least one of which outputs a light beam in response to an input current;
two or more waveguides, each waveguide corresponding to an active region of the array, at least one of which receives the at least one light beam from the at least one active region;
a light combining element that receives and combines the at least one light beam from the two or more waveguides; and
a near-field transducer that receives the combined light and in response thereto generates surface plasmons that are directed to a heat-assisted magnetic recording medium.

2. The apparatus of claim 1, wherein each of the active regions of the array is configured to be activated separately.

3. The apparatus of claim 1, wherein only one active region of the array is activated at a given time.

4. The apparatus of claim 3, wherein a second active region of the array outputs a light beam in response to the input current when a first active region fails.

5. The apparatus of claim 1, wherein two or more active regions of the array together output two or more light beams in response to the input current, and the light combining element receives and combines the two or more light beams from the two or more waveguides.

6. The apparatus of claim 5, wherein the two or more active regions are adjacent each other.

7. The apparatus of claim 5, wherein the two or more light beams are coupled in-phase.

8. The apparatus of claim 5, wherein the two or more light beams comprise a pi-phase, TE10 mode beam.

9. The apparatus of claim 5, wherein the use of the two or more active regions reduces energy concentration in the laser diode.

10. An apparatus, comprising:
a unitary laser diode comprising two active regions that together output a pi-phase, TE10 mode beam;
a focusing element that receives and focuses the beam; and
a near-field transducer that receives the focused beam and in response thereto generates surface plasmons that are directed to a heat-assisted magnetic recording medium.

11. The apparatus of claim 10, wherein the two active regions comprise a dual core coherent laser array.

12. The apparatus of claim 10, wherein the unitary laser diode comprises a single current injection stripe contact.

13. The apparatus of claim 10, wherein each of the active regions comprises a current injection stripe contact.

14. The apparatus of claim 10, further comprising a dual core waveguide configured to deliver the beam to the focusing element.

15. The apparatus of claim 10, wherein the focusing element comprises a solid immersion mirror.

16. A method, comprising:
generating at least one light beam via at least one active region in an array of two more active regions in a unitary laser diode in response to an input current;
receiving, by at least one waveguide of two or more waveguides each corresponding to an active region of the array, the at least one light beam from the at least one active region;
receiving and combining the at least one light beam from the two or more waveguides; and
receiving the combined light by a near-field transducer and in response thereto, generating surface plasmons and directing the surface plasmons to a heat-assisted magnetic recording medium.

17. The method of claim 16, wherein generating at least one light beam comprises generating two or more light beams via two or more active regions.

18. The method of claim 17, wherein the two or more light beams comprise a pi-phase, TE10 mode beam.

* * * * *